United States Patent [19]

Feng et al.

[11] 4,131,497

[45] Dec. 26, 1978

[54] METHOD OF MANUFACTURING SELF-ALIGNED SEMICONDUCTOR DEVICES

[75] Inventors: Bai-Cwo Feng, Wappingers Falls; George C. Feng, Poughkeepsie, both of N.Y.

[73] Assignee: International Business Machines Corporation, Armonk, N.Y.

[21] Appl. No.: 814,829

[22] Filed: Jul. 12, 1977

[51] Int. Cl.² ............... H01L 23/306; H01L 21/265
[52] U.S. Cl. ............................. 148/187; 148/1.5; 156/653; 357/23
[58] Field of Search .............. 156/653, 657; 29/571; 357/23; 148/187, 1.5

[56] References Cited

U.S. PATENT DOCUMENTS

| | | | |
|---|---|---|---|
| 3,783,047 | 1/1974 | Paffen et al. | 148/187 |
| 3,900,352 | 8/1975 | Potter | 148/187 |
| 3,928,082 | 12/1975 | Schwettmann et al. | 148/1.5 |
| 3,948,694 | 4/1976 | Mills | 148/187 |
| 3,961,999 | 6/1976 | Antipov | 148/175 |
| 3,967,981 | 7/1976 | Yamazaki | 148/1.5 |
| 4,028,150 | 6/1977 | Collins et al. | 148/187 |
| 4,040,891 | 8/1977 | Chang et al. | 156/651 |
| 4,052,229 | 10/1977 | Pashley | 148/1.5 |
| 4,053,349 | 10/1977 | Simko | 156/628 |
| 4,060,427 | 11/1977 | Barile et al. | 148/1.5 |
| 4,061,530 | 12/1977 | Hosack | 156/653 |

OTHER PUBLICATIONS

Antipov, "Filling Air Pockets . . . $Si_3N_4$", IBM -TDB, 18 (1975) 732.

*Primary Examiner*—L. Dewayne Rutledge
*Assistant Examiner*—Upendra Roy
*Attorney, Agent, or Firm*—Thomas F. Galvin

[57] ABSTRACT

A method of forming extremely small impurity regions within other impurity regions without the need for providing critical masks. In the preferred embodiment this is achieved by forming an undercut band within masking layers atop a substrate to define a first impurity region, such as the base region of a bipolar transistor. After this region is formed by the introduction of impurities, the undercut is filled-in by a chemical vapor deposition process. A blocking mask may then be used for the formation of the second impurity region, in this case the emitter, within the first region. The window of the second region is defined by the filled-in band, thereby insuring a selected distance between the peripheries of said first and second impurity regions. The same mask may also be used to form other self-aligned regions with the first region.

32 Claims, 8 Drawing Figures

METHOD OF MANUFACTURING SELF-ALIGNED SEMICONDUCTOR DEVICES

CROSS-REFERENCE TO A RELATED APPLICATION

This application is related to a copending application in the name of A. W. Chang and A. K. Gaind, Ser. No. 814,801, IBM Docket No. F19-76-063, filed July 12, 1977, and assigned to the same assignee as the present application.

BACKGROUND OF THE INVENTION

1. Field of the Invention

The present invention relates to the fabrication of semiconductor devices. More particularly, it relates to a method of fabricating planar semiconductor transistors which eliminates critical alignment in registration steps which usually precede the deposition of emitter and other impurity regions.

2. Description of the Prior Art

One problem which has prevented semiconductor designers from increasing the number of transistors which can be fabricated within a semiconductor chip is the registration of one impurity region with another. As photo-and electron beam-lithographic techniques have improved in recent years, the geometries of the active regions within the chip could be decreased substantially from the present ground rules. However, the aforementioned mask registration problems have prevented this from reaching its fullest extent.

The present, widely used techniques of registration usually include the use of fiducial marks on each mask and the underlying semiconductor substrate. These marks are manually registered by a skilled operator; however, the smaller the size of the device, the greater the possibility of registration error by the operator. In addition, this technique is more costly than one which would provide for self-alignment during the fabrication process because each mask must be registered.

Relatively recently, semiconductor designers have turned to the use of said self-alignment masking techniques with blocking masks as a way of avoiding the need for perfect mask alignments at each step. U.S. Pat. Nos. 3,928,082, 3,948,694, 3,967,981 and 3,900,352, the last-mentioned being assigned to the same assignee as the present application, are examples of such self-aligned techniques. However, the manufacturing application of these processes is somewhat limited, either by the necessity for the ion implantation of one or more impurity regions through a mask or because they are useful only in forming spaced-apart regions.

In particular, it has not been possible to form accurately one impurity region within another by means of a blocking mask because of the likelihood of contact between the peripheries of the regions. In practice, this problem has been avoided by designing the masks to allow for substantial misalignment, thereby wasting space. Another solution is the well-known "butting" technique whereby the emitter and base region, for example, abut an isolation region. However, the devices fabricated in this way are not reliable.

A problem apparently not fully appreciated by designers using prior art techniques is the well known lateral undercutting of one masking layer which is disposed beneath another during an etching process. The undercut portion increases the effective masking window for impurities and could result in the overlapping of regions which should be spaced apart.

SUMMARY OF THE INVENTION

It is, therefore, one object of our invention to provide an improved method of introducing a self-aligned impurity into a semiconductor substrate or into another impurity region within said substrate.

It is another object of our invention to provide an improved method of forming two or more impurity regions within a substrate or other impurity region, said two or more regions being self-aligned.

These and other objects of our invention are achieved by putting to advantage the undercut which occurs during the etching of a composite mask such as silicon nitride and silicon dioxide. We use this undercut to insure that there is a selected minimum distance between the periphery of one impurity region and another, e.g., the emitter and base of a planar transistor.

In general, our invention comprises forming a first masking layer which includes lower and upper materials which are selectively etchable with respect to each other atop a substrate, and etching a first window within the first masking layer so as to cause a portion of the upper layer to overhang the lower layer at the periphery of said first window. This is the undercut. We then form a second masking layer within the first window so as to fill-in the undercut.

This second masking layer includes, but is not limited to, another material which is etchable with the same etchant as the upper material of the first masking layer. Preferably, said other material at least partially fills-in the undercut and also covers at least the portion of the first masking layer disposed at the periphery of the first window. Alternatively, either one of these conditions may be satisfactory by itself.

By this means, the total quantity of material which is etchable by the etchant is thinner within the first window than at the periphery. The process is completed by etching a second window within the first window through the second masking layer, with the material at said periphery acting as a mask, and introducing an impurity through said second window into said substrate.

In our preferred embodiment, the undercut is etched to be around 0.7 microns. A base region is formed within the first window prior to forming the second masking layer. An emitter region is then formed within the second window. All things being equal, there results a 0.7 micron distance or thereabouts between the peripheries of the emitter and base region, thereby ensuring self-alignment.

In a significant feature of our invention, more than one region may be formed in the base region. For example, the emitter and the base contacts may be formed in self-alignment merely with the use of a blocking mask.

DETAILED DESCRIPTION OF THE PREFERRED EMBODIMENTS

Figure 1A:
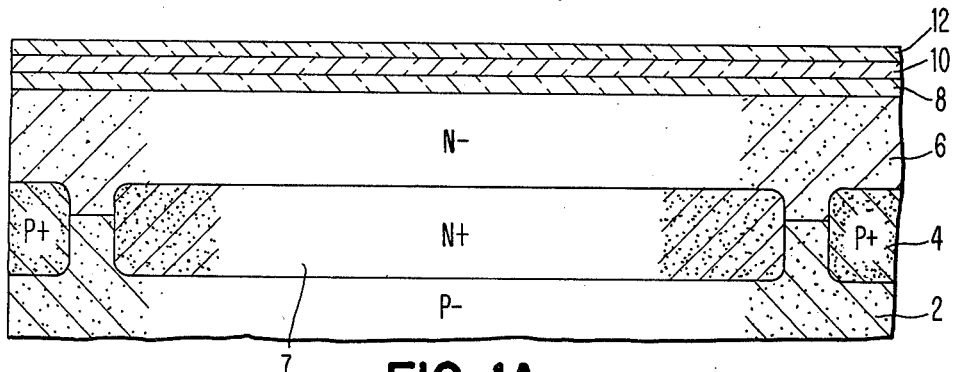
FIGS. 1A-1J illustrate cross-sectional views of a semiconductor at various stages of the fabrication process of the present invention.

FIG. 1A illustrates a partially completed bipolar transistor which has been fabricated using conventional techniques. A N+ buried layer 7 is disposed partially within a P type semiconductor substrate 2 and partially within an N- epitaxial layer 6. This subcollector region is typically formed by diffusing an arsenic impurity into substrate 2 and thereafter growing a N-type epitaxial layer 6 to a thickness of around 2.0 microns.

The substrate also contains a P+ isolation diffusion which encircles subcollector region 7. P+ region 4 is typically formed by diffusing a boron impurity into semiconductor body 2 prior to the epitaxial deposition, which process causes it to out-diffuse into epitaxial layer 6. As mentioned, the process for forming the subcollector and isolation regions are by now well known to those of skill in the art and can be accomplished by various methods, of which the previous description is merely exemplary. In addition, the thickness of layer 6 may be more or less than 2.0 microns.

Disposed atop epitaxial layer 6 are three masking layers, enumerated 8, 10, and 12; these are preferably silicon dioxide, silicon nitride and silicon dioxide, respectively. Layer 8 is thermally grown from the epitaxial layer 6 to a thickness of between 1400 to 2000Å. Silicon nitride layer 10 is deposited by a chemical vapor deposition system to between 500 to 1500Å. Layer 10 may instead comprise silicon oxynitride. Layer 12 is chemically vapor deposited silicon dioxide. The sole purpose of silicon dioxide layer 12 is to mask nitride layer 10, because etchants, such as hot phosphoric acid, which attack silicon nitride also attack conventional resist. Sputtered silicon dioxide or other well known masks could be substituted for the chemically vapor deposited layer 12. Moreover, layer 12 may be omitted entirely if the etching were accomplished in a plasma system. This type of etching is commonly termed reactive ion or plasma etching. For example, nitride layer 10 may be etched using a mixture of $CF_4$ and $O_2$ gases in a plasma system and using AZ1350H resist as a mask. A suitable plasma system is marketed by the LFE Corporation and a suitable gas is marketed as DE100, also by the LFE Corporation. AZ1350J and H are products of the Shipley Company.

Figure 1B:
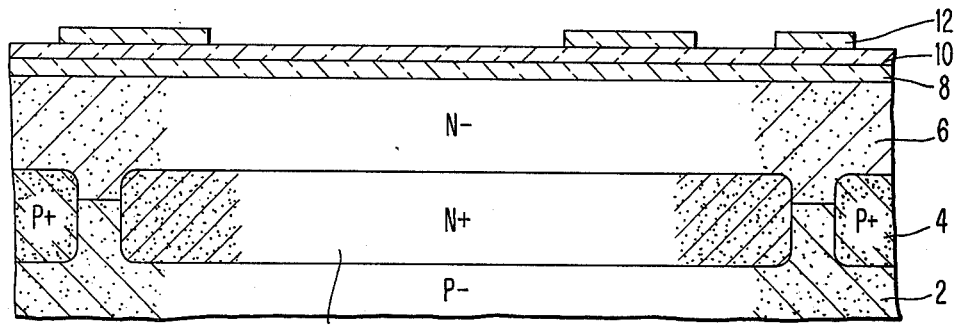
Figure 1C:
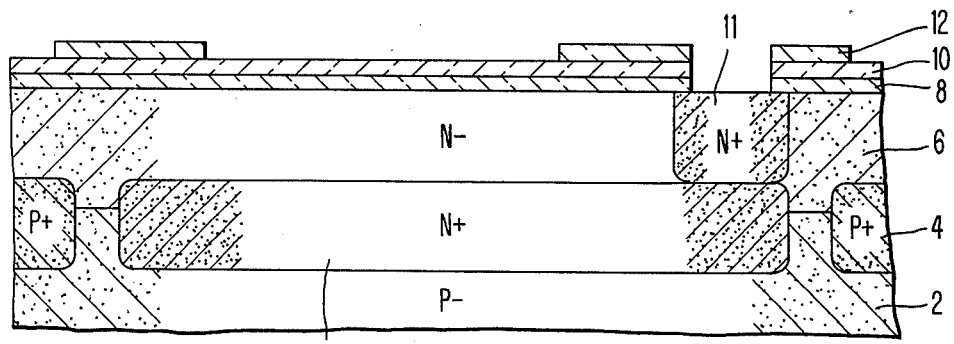

As shown in FIG. 1B openings are etched in silicon dioxide layer 12 using a mask which defines the various regions in the transistor. In the illustration the base region, the subcollector reach-through region and the isolation regions are defined by the mask. Other regions, such as Schottky barrier diodes and resistors may also be defined by the same mask at adjacent locations in epitaxial layer 6. The Schottky barrier diode and the resistor which may be associated with the transistor are not illustrated; but their formation proceeds with the same process steps as the formation of the subcollector reach-through region 11 which will be described.

The dimensional mask which defines the device regions typically comprises a photo-resist such as AZ1350J which is exposed and developed in a well known manner. The pyrolytically deposited silicon dioxide layer 12 may be etched by a solution of hydrofluoric acid buffered in ammonium fluoride, an etchant which does not substantially attack silicon nitride. The areas of nitride layer 10 which are exposed by the windows formed in layer 12 may then be etched in hot phosphoric acid or any other etchant which does not attack silicon dioxide. The regions separating the subcollector and isolation region are masked by the photoresist during the etching process. Thus, at this stage certain ones of the device regions are defined in the layer 12.

Figure 1D:
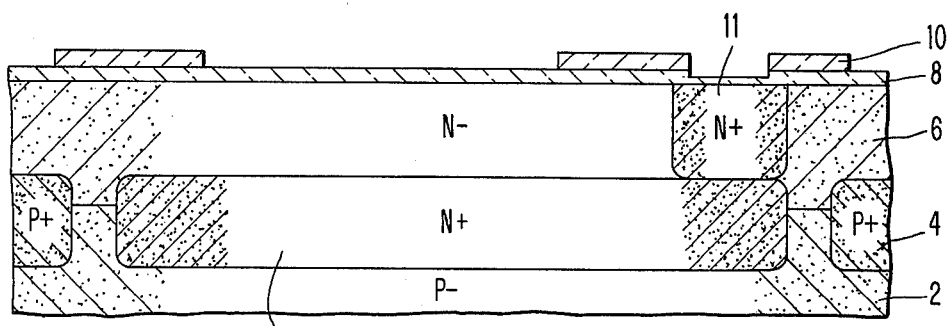

A blocking mask of photoresist is then used to open the subcollector reach-through window as well as the window for the resistor region (not shown). The pattern for the subcollector regions and the resistor regions are further defined by etching the exposed areas of silicon nitride 10 in hot phosphoric acid or any other etchant which does not attack silicon dioxide. After the openings have been made in silicon nitride layer 10, the semiconductors are exposed to an etchant which will attack the areas of oxide layer 8 which are exposed in the openings of nitride layer 10. Preferably, hydrofluoric acid buffered in ammonium fluoride, is again used to etch layer 8. The other regions of silicon nitride layer 10 and silicon dioxide layer 8 are protected by the photoresist block mask and are not attacked. The photoresist layer is then stripped completely and a diffusion is made through the opening to form subcollector reach-through region 11. The subcollector dopant is typically phosphorus, although it may also be arsenic or other Group V impurity. The phosphorus is driven in at around 1000° C. in an oxidizing ambient which causes the oxide layer to regrow to a depth of around 1400Å as illustrated in FIG. 1D. Thus, at this point the pyrolitically deposited oxide layer 12 has been stripped, the N+ reach-through region 11 and the optional resistor region (not shown) have been formed. The substrate is completely covered with thermal oxide layer 8 and the remaining device regions to be formed are defined by silicon nitride layer 10.

Figure 1E:
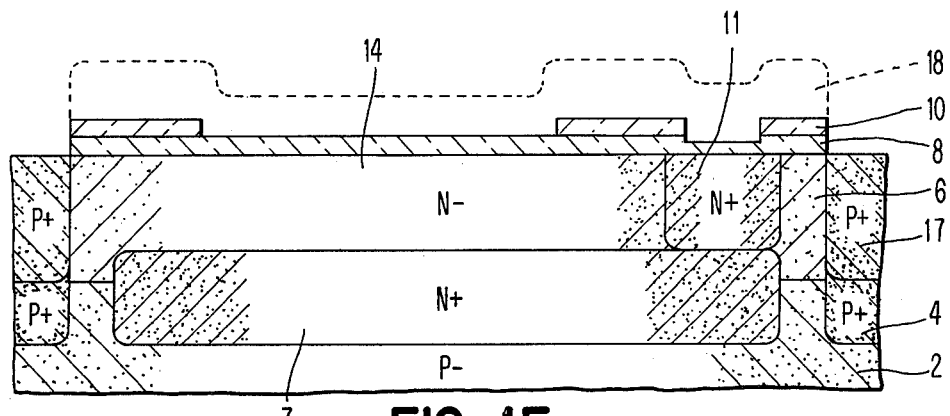

At this point in the process, a window is opened to P+ region 17 through oxide layer 8. The thermal oxide layer over N— region 14, reach-through region 11 and the resistor region are protected by blocking mask 18. A diffusion of P type material, typically boron, is then made into the exposed region so as to form P+ isolation region 17 as shown in FIG. 1E.

Figure 1F:
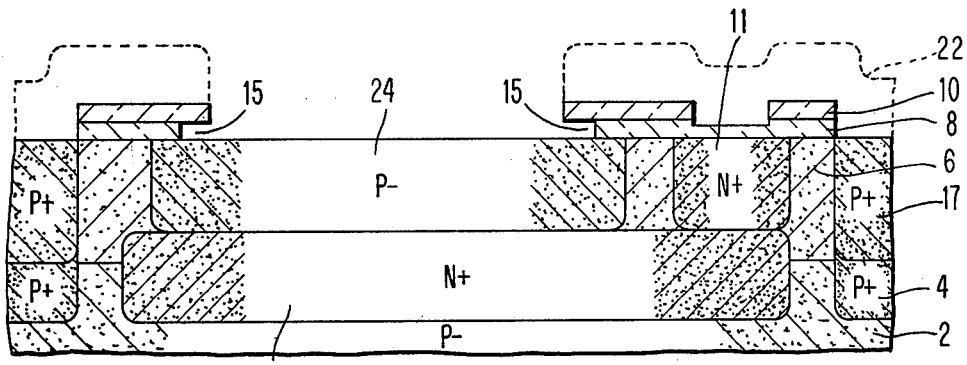

In the next step illustrated in FIG. 1F, another blocking mask 22 is used to protect all regions of the substrate except region 14. A window is then etched in oxide layer 8 to expose region 14. This etching process results in the undercutting of the nitride layer 10 at regions 15; that is, a band of oxide material is removed under the nitride to leave the overhang. This undercutting is critical to our invention and may be carefully controlled when the silicon dioxide layer 8 is etched in buffered hydrofluoric acid. The etch rate of thermal oxide in 7:1 buffered hydrofluoric acid at 31° C. is about 1600Å per minute. Thus, when the windows 14 are opened the etching is continued to achieve an undercutting of around 0.6 to 0.7 microns. Alternatively, the etching could be accomplished by plasma etching in the system discussed hereinabove to yield a controlled undercut.

The P type base region 24 is then diffused into the N— epitaxial region 6. The base region may also be ion implanted and then driven-in using standard techniques to achieve substantially the same type of base region. Thus, the diffusion window defined by the thermal oxide layer 8 is at least 0.6-0.7 microns wider on each side than the window formed by silicon nitride layer 10.

Figure 1G:
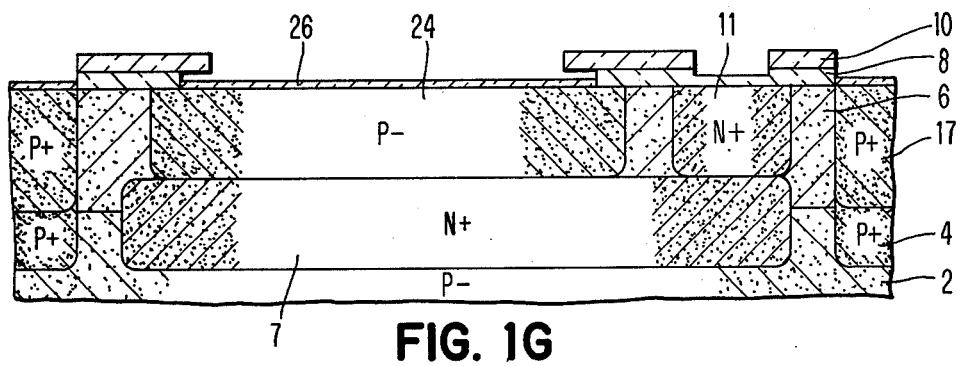

In the typical base diffusion process, $BBr_3$ is deposited in a dry oxygen and argon atmosphere at around 875° C. to a thickness of around 400Å of borosilicate glass. After the diffusion the glass is etched in buffered hydrofluoric acid to remove the glass and the base is formed by the standard drive-in and reoxidation process which occurs typically at 925° C. in steam and oxygen. This forms a layer 26 of about 800Å of thermally grown silicon dioxide over the base and isolation regions as shown in FIG. 1G. Oxide 26 also forms underneath the silicon nitride overhang.

It should be noted at this point that P regions 17 and 24 could be formed simultaneously, depending on the process design parameters.

Figure 1H:
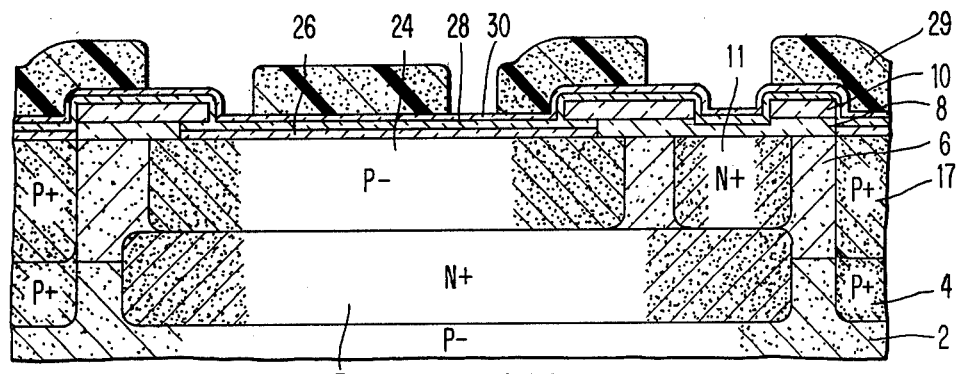
Figure 1:
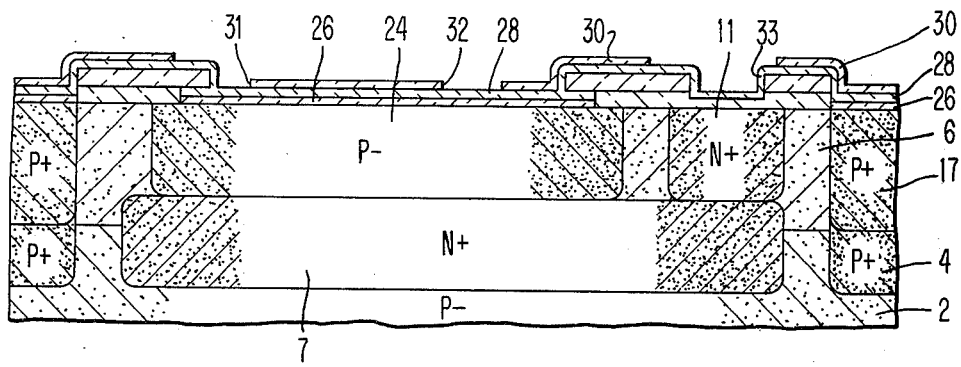
Figure 1:
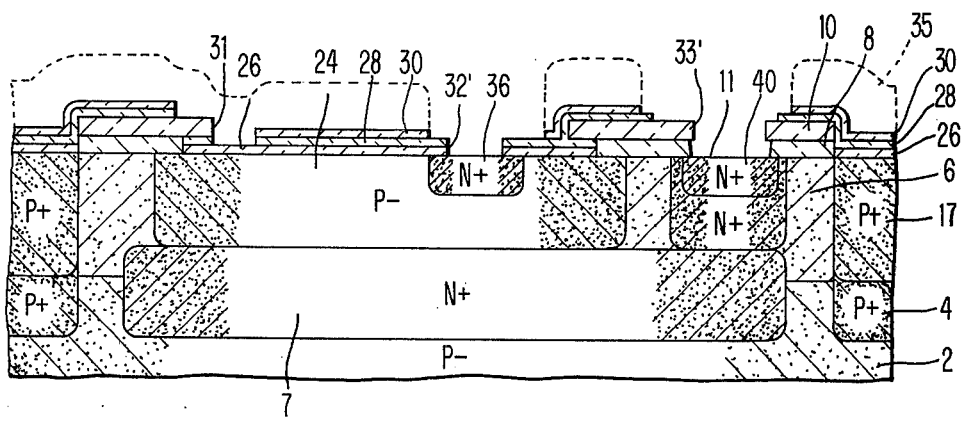

In the next step shown in FIG. 1H, layers of silicon nitride and silicon dioxide, enumerated 28 and 30 respectively, are deposited by either chemical vapor deposition or by sputtering. The thickness of layers 28 and 30 are preferably around 1000Å. Layer 30 is needed only as a mask for silicon nitride layer 28 during wet etching with hot phosphoric acid. The deposition results in completely filling in the overhang below silicon nitride at undercut region 15. The composition and thickness of the materials deposited may be varied. For example, although less desirable, base oxide layer 26 could be made thicker so as to fill-in the undercut 15 without the need for silicon nitride doing so. In addition, silicon nitride could be replaced by silicon oxynitride or another masking material. In fact, layer 28 could be silicon oxynitride and layer 10 could be silicon nitride, or vice-versa. The important consideration is that the thickness of the masking layer at the periphery of the base window is greater than the thickness of the masking layer within the window, both of which are etchable with the same etchant. In this way blocking masks may be used to define the emitter and other impurity regions without the problem of etching down to protected areas of the substrate.

A single mask 29 is then used to form windows atop oxide layer 30 which define the base contact and emitter regions over base region 24. The embodiment illustrated shows a single window for the base contact region which is to be formed; however, two or more contacts on each side of the emitter may also be formed. The width of the emitter within base region 24 is carefully controlled by our novel process. This is made possible by the existence of the filled-in undercut 15 and the double masking layers at the periphery of the base window. Because it sharply defines the emitter window, this double layer prevents the emitter from diffusing laterally too closely to the periphery of base region 24.

As shown in FIG. 1I, the silicon layer 30 is then etched through blocking mask 29 to open windows 31, 32 and 33. Silicon nitride 28 is also etched away at the exposed portions, using oxide layer 30 as a mask.

A second blocking mask 35 which protects region 31 from etching is then used to etch away the thermal oxide layer 26 in windows 32 and 33 as shown in FIG. 1J. Standard etching techniques of buffered hydrofluoric acid or plasma etching may be used to expose the windows 32' and 33' down to the surface of layer 6. Emitter region 36 is then formed by a suitable technique, such as the diffusion of arsenic. Simultaneously, the conductivity of the reach-through region 11 is increased by the arsenic diffusion in area 40.

An opening for a Schottky barrier diode may also be formed during these process steps down to epitaxial layer 6 at a region not shown.

The contact to the base region may be made by blocking openings 32 and 33 by a blocking mask while leaving that portion of oxide layer 26 in window 31 exposed. It may be desirable to lay a thin screen oxide of around 100Å thick in the emitter and subcollector regions to protect these regions against contamination by the photoresist. The oxide in window 31 is removed, thereby exposing the base contact region for subsequent metallization (not shown).

Figure 2:
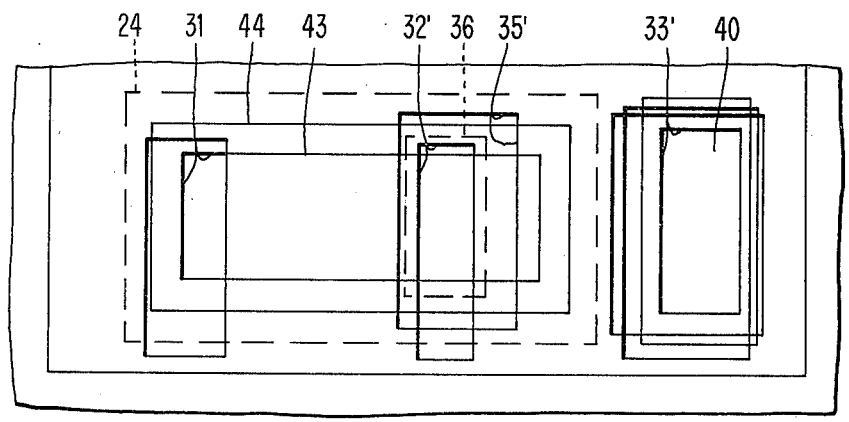
FIG. 2 illustrates a top view of a device at the stage of manufacture represented by FIG. 1J.

FIG. 2 is a top plan view of the transistor at the state of manufacture illustrated in FIG. 1J, showing the self-aligned emitter region 36 within base region 24. There is always a selected distance between the edge of the emitter 36 and the edge of the base 24 because of the undercut discussed previously. At the present state of the art this undercut is at least 0.7 microns.

The base region mask defined by silicon nitride layer 10 and the base diffusion window defined by oxide layer 8 in FIG. 1F are identified by the numerals 43 and 44, respectively. The emitter region mask is defined by window 32' and the opening defined by blocking mask 35 is identified as 35'. Both of these masks are shown deliberately misaligned, as this has no effect on emitter alignment because of our novel process. It should also be noted that emitter mask 32' overlaps base mask 43, indicating the wide latitude permitted by our process in mask configurations.

While our invention has been particularly shown and described with respect to preferred embodiments thereof, it will be understood by those skilled in the art that the foregoing and other changes in form and details may be made without departing from the spirit and scope of our invention.

For example, the particular masking materials described may be replaced by others and various types impurity regions devices may be fabricated.

We claim:

1. A method for forming an impurity region in a semiconductor substrate comprising the steps of:
   forming a first masking layer atop said substrate, said layer including lower and upper materials which are selectively etchable with respect to each other;
   etching a first window within said first masking layer so as to cause a portion of said upper layer to overhang said lower layer at the periphery of said first window;
   forming a second masking layer, which includes a material which is etchable with the same etchant as said upper material, within said first window so as to fill-in said overhang;
   whereby the material which is etchable by said ethchant is thinner within said first window than at said periphery;
   etching a second window within said first window through said second masking layer, said material at said periphery acting as a mask; and
   introducing an impurity through said second window into said substrate to form said impurity region.

2. A method as in claim 1 wherein:
   said lower material of said first masking layer is silicon dioxide; and
   said upper material of said first masking layer is selected from the group consisting of silicon nitride and silicon oxynitride.

3. A method as in claim 1 wherein said included material in said second masking layer is selected from the group consisting of silicon nitride and silicon oxynitride.

4. A method as in claim 3 wherein the step of forming said second masking layer includes, prior to the forming of said material which is selected from said group consisting of silicon nitride and silicon oxynitride:
   thermally growing silicon dioxide from said substrate, whereby said thermally-grown silicon dioxide at least partially fills-in said overhang.

5. A method as in claim 1 wherein:

said lower material of said first masking layer is silicon dioxide;
said upper material of said first masking layer is silicon nitride; and
said second masking layer includes an upper coating of silicon nitride and a lower coating of silicon dioxide.

6. A method as in claim 5 for defining a second region within said first window which is self-aligned with respect to said impurity region comprising:
etching a third window through said silicon nitride coating during said etching of said second window through said silicon nitride coating, while protecting the other portions of said masking layers; and
etching said third window through said silicon dioxide coating after said etching of said second window through said silicon dioxide coating, while protecting the other portions of said masking layers and said second window.

7. A method as in claim 6 further comprising:
during the formation of said impurity region, forming another impurity region of the same conductivity type in an area of said substrate outside of said first window.

8. A method for forming an impurity region in a semiconductor substrate comprising the steps of:
forming a first masking layer atop said substrate, said layer including lower and upper materials which are selectively etchable with respect to each other;
etching a first window within said first masking layer so as to cause a portion of said upper material to overhang said lower material at the periphery of said first window;
forming a second masking layer atop said substrate within said first window so as to fill-in said overhang, said layer including lower and upper materials which are selectively etchable with respect to each other;
said upper material of said second masking layer covering at least the portion of said upper material of said first masking layer at the periphery of said first window;
said upper materials being etchable by the same etchant;
etching at least a second window through said upper and lower materials of second masking layer, said material at said periphery acting as a mask; and
introducing an impurity through said second window into said substrate to form said impurity region.

9. A method as in claim 8 for defining another region within said first window which is self-aligned with respect to said impurity region comprising:
etching a third window through said upper material of said second masking layer during said etching of said second window through said upper material of said second masking layer, while protecting the other portion of said masking layers;
etching said third window through said lower material of said second masking layer after said etching of said second window through said lower material of said second masking layer, while protecting the other portions of said masking layers and said second window.

10. A method as in claim 8 further comprising the step of:
during the etching of said second window, etching another window through said first and second masking layers at a portion of said substrate which is outside of said first window; and
introducing another impurity through said other window to form another impurity region.

11. A method as in claim 8 wherein said lower material of said second masking layer fills-in said overhang to the substantial exclusion of said upper material of said second masking layer.

12. A method as in claim 8 wherein said lower and upper material of said second masking layer jointly fill-in said overhang.

13. A method as in claim 8 wherein:
said upper materials of said masking layers are selected for the group consisting of silicon nitride and silicon oxynitride; and
said lower materials are silicon dioxide.

14. A method as in claim 8 wherein:
said lower materials are silicon dioxide;
said upper materials are silicon nitride.

15. A method as in claim 14 for defining a second region within said first window which is self-aligned with respect to said impurity region comprising:
etching a third window through said silicon nitride portion of said second masking layer during the etching of said second window through said silicon nitride portion of said second masking layer while protecting the other portions of said masking layers; and
etching said third window through said silicon dioxide portion of said second masking layer after said etching of said second window through said silicon dioxide portion of said second masking layer, while protecting the other portions of said masking layers and said second window.

16. A method as in claim 15 further comprising:
during the formation of said impurity region, forming another impurity region of the same conductivity type in an area of said substrate outside of said first window.

17. A method for forming a PN junction in a semiconductor substrate comprising the steps of:
forming a first masking layer atop said substrate, said layer including lower and upper materials which are selectively etchable with respect to each other;
etching a first window within said first masking layer so as to cause a portion of said upper layer to overhang said lower layer at the periphery of said window;
introducing an impurity of a first conductivity type through said first window into said substrate to form a first impurity region;
forming a second masking layer which includes a material which is etchable with the same etchant as said upper material within said first window so as to fill-in said overhang;
whereby the material which is etchable by said etchant is thinner within said first window than at said periphery;
etching a second window within said first window through said second masking layer, said material at said periphery acting as a mask; and
introducing an impurity of a second conductivity type through said second window into said first impurity region to form said PN junction.

18. A method as in claim 17 wherein:
said lower material of said first masking layer is silicon dioxide; and said upper material of said first masking layer is selected from the group consisting of silicon nitride and silicon oxynitride.

19. A method as in claim 17 wherein said included material in said second masking layer is selected from the group consisting of silicon nitride and silicon oxynitride.

20. A method as in claim 19 wherein the step of forming said second masking layer includes, prior to the forming of said material which is selected from said group consisting of silicon nitride and silicon oxynitride:
thermally growing silicon dioxide from said substrate, whereby said thermally-grown silicon dioxide at least partially fills-in said overhang.

21. A method as in claim 17 wherein:
said lower material of said first masking layer is silicon dioxide;
said upper material of said first masking layer is silicon nitride; and
said second masking layer includes an upper coating of silicon nitride and a lower coating of silicon dioxide.

22. A method as in claim 21 for defining a second region within said impurity region of said first conductivity type which is self-aligned with respect to said impurity region of said second conductivity type comprising:
etching a third window through said silicon nitride coating during said etching of said second window through said silicon nitride coating, while protecting the other portions of said masking layers; and
etching said third window through said silicon dioxide coating after said etching of said second window through said silicon dioxide coating, while protecting the other portions of said masking layers and said second window.

23. A method as in claim 22 further comprising:
during the formation of said impurity region of said second conductivity type, forming another region of said second conductivity type in an area of said substrate outside of said window.

24. A method for forming a PN junction in a semiconductor substrate comprising the steps of:
forming a first masking layer atop said substrate, said layer including lower and upper materials which are selectively etchable with respect to each other;
etching a first window within said first masking layer so as to cause a portion of said upper layer to overhang said lower layer at the periphery of said window;
introducing an impurity of a first conductivity type through said first window into said substrate to form a first impurity region;
forming a second masking layer within said first window so as to fill-in said overhang, said layer including lower and upper materials which are selectively etchable with respect to each other;
said upper material of said second masking layer covering at least the portion of said upper material of said first masking layer at the periphery of said first window;
said upper materials being etchable by the same etchant;
etching at least a second window through said upper and lower materials of said second masking layer, said material at said periphery acting as a mask; and
introducing an impurity of a second conductivity type through said second window into said first impurity region to form said PN junction.

25. A method as in claim 24 for defining another region within said first window which is self-aligned with respect to said impurity region of said second conductivity type comprising:
etching a third window through said upper material of said second masking layer during said etching of said second window through said upper material of said second masking layer, while protecting the other portion of said masking layers;
etching said third window through said lower material of said second masking layer after said second conductivity type region is formed while protecting the other portions of said masking layers and said second window.

26. A method as in claim 24 further comprising the step of:
during the etching of said second window, etching another window through said first and second masking layers at a portion of said substrate which is outside of said first window; and
introducing an impurity of said second conductivity type through said other window to form another impurity region.

27. A method as in claim 24 wherein said lower material of said second masking layer fills-in said overhang to the substantial exclusion of said upper material of said second masking layer.

28. A method as in claim 24 wherein said lower and upper material of said second masking layer jointly fill-in said overhang.

29. A method as in claim 24 wherein:
upper materials of said masking layers are selected from the group consisting of silicon nitride and silicon oxynitride; and
said lower materials are silicon dioxide.

30. A method as in claim 24 wherein:
said lower materials are silicon dioxide;
said upper materials are silicon nitride.

31. A method as in claim 30 for defining a second region within said first window which is self-aligned with respect to said impurity region comprising:
etching a third window through said silicon nitride portion of said second masking layer during the etching of said second window through said silicon nitride, portion of said second masking layer while protecting the other portions of said masking layers; and
etching said third window through said silicon dioxide portion of said second masking layer after said etching of said second window through said silicon dioxide, portion of said second masking layer, while protecting the other portions of said masking layers and said second window.

32. A method as in claim 31 further comprising:
during the formation of said impurity region, forming another impurity region of the same conductivity type in an area of said substrate outside of said first window.

* * * * *